United States Patent [19]

Tsujimoto et al.

[11] Patent Number: 5,418,348
[45] Date of Patent: May 23, 1995

[54] ELECTRON BEAM SOURCE ASSEMBLY

[75] Inventors: Nick Tsujimoto, Moraga; Jim Moore, Manteca, both of Calif.

[73] Assignee: MDC Vacuum Products, Inc., Hayward, Calif.

[21] Appl. No.: 968,192

[22] Filed: Oct. 29, 1992

[51] Int. Cl.⁶ .................... B23K 15/00; H01J 37/305
[52] U.S. Cl. .................. 219/121.15; 219/121.27; 219/121.12; 373/11; 373/13; 373/14
[58] Field of Search .............. 373/11, 12, 13, 14; 219/121.15, 123, 121.12, 121.27

[56] References Cited

U.S. PATENT DOCUMENTS

| | | | |
|---|---|---|---|
| 3,801,719 | 4/1974 | Pudliner | 373/13 |
| 4,064,352 | 12/1977 | Mann | 373/13 |
| 4,748,935 | 6/1988 | Wegmann | 118/723 |
| 5,012,064 | 4/1991 | Chang et al. | 219/121.15 |
| 5,182,488 | 1/1993 | Hill et al. | 373/13 X |

*Primary Examiner*—Mark H. Paschall
*Attorney, Agent, or Firm*—Janet K. Castaneda; James E. Eakin

[57] ABSTRACT

An electron beam source assembly includes a water cooled crucible positioned substantially flush with the top of the block. A magnet is attached to each long sides of the rectangular block to establish parallel opposed pole magnets with the crucible therebetween. A smaller magnet is attached to each end of each longitudinal magnet to form a second and a third parallel magnet pair. The six magnets produce plano-convex magnetic field lines above the crucible, and additional plano-convex field lines of increased field strength extending outwardly from the end of the block having the four magnets. A magnetic base plate provides a low reluctance path to decrease magnetic flux at the crucible. An electron gun emitter mechanism is sheltered from vapors formed at the crucible and includes architecture to enable electrons to be freely emitted from the filament, without being subjected to the magnetic field lines from the magnet pairs, in a direct path outwardly through an open cavity and through a window formed in the end of the electron source assembly. The freely emitted electron beam assumes a trajectory passing solely through plano-convex magnetic field lines to produce an inverted image at the crucible that is substantially a one-to-one mapping of the filament.

26 Claims, 6 Drawing Sheets

ELECTRON BEAM SOURCE ASSEMBLY

FIELD OF THE INVENTION

The present invention relates to an electron beam source assembly for high pressure differential/vacuum operating environments. More particularly, the invention relates to an electron gun for vaporizing materials for thin film deposition on a substrate placed in a high or ultra high vacuum environment.

BACKGROUND OF THE INVENTION

Electron beam source assemblies, particularly electron gun assemblies used in the field of thin film deposition, are known in the prior art. Such assemblies typically utilize a thermionic emitter mechanism to generate and accelerate an electron beam. The accelerated electron beam is deflected by a magnetic field into a crucible structure containing one or more materials. The material(s) are vaporized by the electron beam and deposited on the desired substrate. One such electron beam source assembly is disclosed in U.S. Pat. No. 3,883,679 to Shrader et al.

The electron beam source assemblies described above, including the Shrader device, typically form the water cooled crucible in a metallic block, place the emitter mechanism at a distance from the crucible to prevent damage to the emitter, and position permanent or electromagnets to generate a transverse magnetic field to deflect the electron beam and focus it onto the crucible.

The transverse magnetic field used to deflect the electron beam is typically generated between and perpendicular to parallel pole pieces extending from a single magnet, or between spaced, parallel magnets. The transverse magnetic field generally includes uniform field lines between the magnetic pieces, plano-convex field lines above and at the ends of the magnetic pieces, and convex field lines above the plano-convex field lines.

The magnetic structure employed in electron gun assemblies as described herein typically generates field lines at the emission site of the electron gun assembly to contain the emitted beam within the assembly and prevent loss or dissipation of the beam therefrom. The beam is typically injected from the emitter into a recess formed in the metallic block and subject to the magnetic field where it generally passes first, through uniform field lines, then through plano-convex and convex field lines, and again through uniform field lines surrounding the crucible. The passage of the beam through such changing magnetic field lines causes the electron beam to diverge and re-converge several times along its trajectory thereby creating several focal points. The establishment of multiple focal points makes the beam difficult to focus and to control. When it is desired to move the beam, the changing field lines and multiple focal points make it difficult to predict the size, shape and density of the newly positioned beam.

The difficulty described above in controlling and focusing electron beams is compounded by the typical architecture of the prior art emitter mechanism. As shown in the Shrader patent discussed above, the emitter mechanism of electron guns used for vaporizing materials in a high vacuum environment typically includes an electron emitting filament partially shielded by a beam former and by the anode structure. The negative potential at the shielding beam former and the anode generate resistance to electron emission from the filament. When electrons are emitted from the partially obstructed filament into a high negative potential, they are initially directed downward into an open cavity of high negative potential containing the cathode structure which typically defines an irregular surface with notches, bolts and shelf areas. Thus, the electron beam in prior art emitter assemblies is emitted downwardly through irregular electrostatic field lines before it rises towards the anode and encounters the variously shaped magnetic field lines discussed above. The architecture of prior art electron gun assemblies, together with the differing magnetic field lines of the magnetic structures used to deflect the electron beam, make it difficult to control and focus the beam upon the source material in the crucible.

Attempts to solve the problems of focusing and control of electron guns used for vaporization in high vacuum environments have centered primarily upon efforts to continue re-converging the electron beam by varying the magnetic structures in the assemblies. Several examples include two Hanks patents, U.S. Pat. Nos. 4,835,789 and 4,947,404. The Hanks devices use a plurality of small, horizontal or vertically aligned magnets placed around the crucible. The magnets may be moved as needed to control the electron beam.

Other attempts to control the beam include lowering the position of the crucible within the electron gun assembly to confine the generally circular or oval trajectory of the beam. When the crucible is below the top surface of the electron gun assembly, vaporized material solidified on the cooler lip area formed above the crucible may flake off and fall into the crucible thereby adversely affecting thin film deposition. Additionally, lowering the crucible into the assembly subjects the crucible and electron beam to further undesirable repelling magnetic field lines from the magnetic structure. Repelling magnetic field lines around the crucible cause the electron beam trajectory to circle toward the crucible walls thereby undesirably increasing the temperature on the walls. The Shrader patent discussed above added magnetic shielding in an attempt to prevent unwanted field lines from affecting the crucible. Additional magnetic structure further complicates the magnetic field lines of the assembly thereby making it more difficult to predict the effects of moving the beam around the crucible.

As can be seen from the discussion of the prior art, an unsolved need exists for an improved electron gun assembly for vaporization of substances in high or ultra high vacuum environments, the assembly increasing electron emission and providing a magnetic structure designed to create a focusable, moveable electron beam with an improved trajectory travelling to and passing through the crucible, and providing an uniform image of the beam emitter at the target.

SUMMARY OF THE INVENTION WITH OBJECTS

A general object of the present invention is to provide an electron beam source assembly for vaporizing substances in a high or ultra high vacuum environment that overcomes the drawbacks and limitations of the prior art.

A first specific object of the present invention is to provide an electron beam source assembly enabling a deflected electron beam to be formed in the image of the emitter source when it reaches the target, the electron beam at the target being moveable while maintaining a uniform size, shape, and electron density.

A specific object of the present invention is to provide an electron beam source assembly having an electron gun mechanism enabling electrons to be freely emitted outside the magnetic field lines of the assembly.

Another specific object of the present invention is to provide an electron beam source assembly having an electron gun mechanism which injects the emitted electrons into plano-convex magnetic field lines.

An additional specific object of the present invention is to provide an electron beam source assembly having an electron gun mechanism which enables increased electron emission at lower temperatures and lower power consumption, and enables increased evaporation of the target material.

Yet another specific object of the present invention is to provide an electron beam source assembly with a magnetic structure positioned to decrease unwanted magnetic flux at the crucible, and positioned so that the electron beam is only deflected and focused by plano-convex magnetic field lines.

Still one more specific object of the present invention is to provide an electron beam source assembly with the crucible positioned substantially at the top surface of the assembly to prevent contamination of the source material.

Yet one more specific object of the present invention is to provide a compact electron beam source assembly suitable for use in any high or ultra high vacuum environment to deflect and focus an electron beam.

Still another object of the present invention is to provide an electron beam source assembly with a emitter mechanism shielded to prevent contamination.

In accordance with the principles of the present invention, an electron beam source assembly includes a water cooled crucible formed in a metallic, generally rectangular block. The opening of the frustoconical crucible is substantially flush with the top of the block. A pair of magnets is attached to the longitudinal sides of the block, one on each longitudinal side thereby establishing parallel spaced magnets with the crucible therebetween. A smaller magnet is attached to each longitudinal magnet at each end of the block thereby forming a second and a third parallel magnet pair. The six magnets produce plano-convex magnetic field lines above the crucible; and additional plano-convex field lines of increased field strength extending outwardly from the ends of the block having the four magnets. A magnetic base plate provides a low reluctance path to decrease magnetic flux at the crucible.

An electron gun emitter mechanism is positioned at one end of the block and is sheltered from vapors formed at the crucible. The electron gun mechanism includes an emission filament mounted between a split cathode block assembly having a beam shield and a beam former. The architecture of the electron gun mechanism enables electrons to be freely emitted from the filament, without being subjected to the magnetic field lines from the magnet pairs, in a direct path outwardly through an open cavity and through a window formed in the end of the electron source assembly.

As the freely emitted electron beam leaves the electron beam source assembly, the strong plano-convex magnetic field lines created by the four magnets at the end of the assembly sharply bend the beam upwardly where it continues its trajectory into the crucible, the trajectory passing solely through plano-convex magnetic field lines. The inverted image at the crucible is substantially a one-to-one mapping of the filament. The beam travels substantially in a straight path through the crucible.

In another aspect of the present invention, the electron beam source assembly defines multiple crucibles for thin film deposition of multiple layers of materials.

These and other objects, advantages and features of the present invention will become more apparent upon considering the following detailed description of a preferred embodiments, presented in conjunction with the accompanying drawings.

DESCRIPTION OF PREFERRED
EMBODIMENTS

Figure 1:
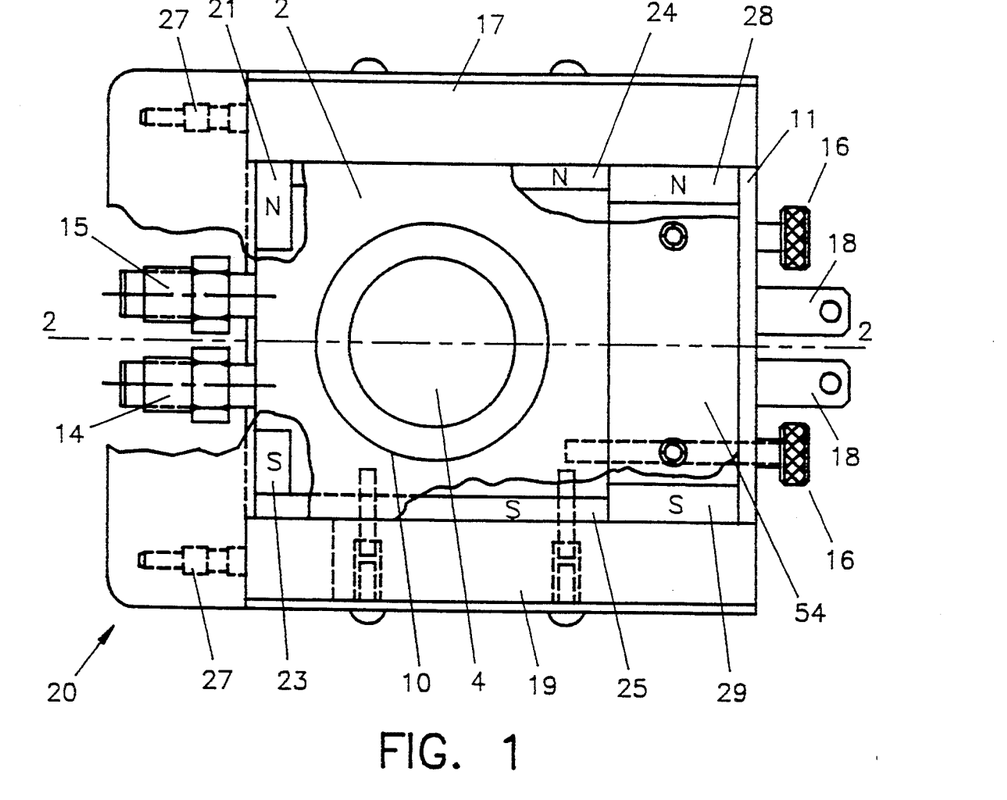
FIG. 1 is a top view of an electron beam source assembly, partially cut away, for vaporizing of a material in a high vacuum environment embodying the principles of the present invention.
Figure 2:
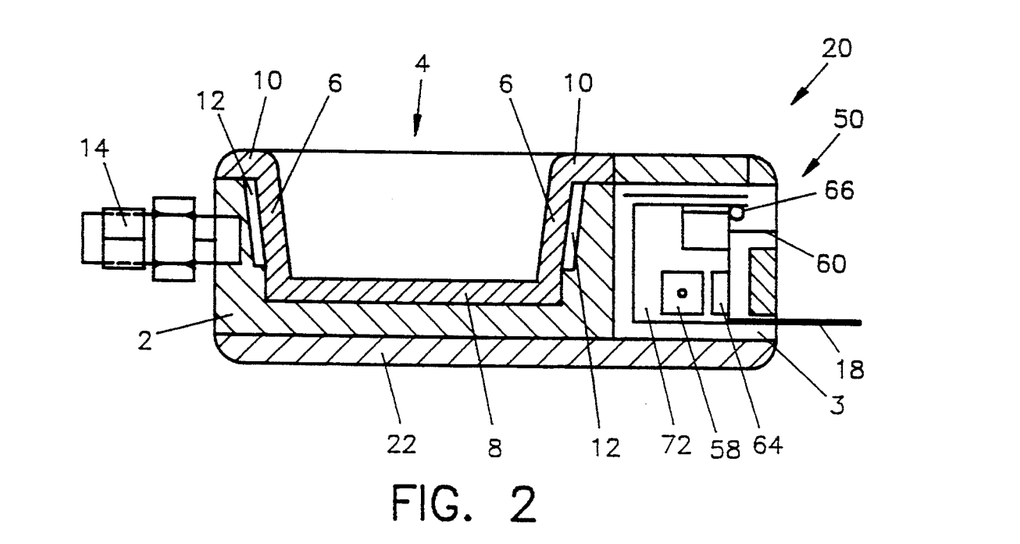
FIG. 2 is a side sectional view of the electron beam source assembly shown in FIG. 1 taken along lines, 2—2.

An electron beam source assembly for vaporizing materials for thin film deposition on a substrate in a high vacuum environment and embodying the principles of the present invention is shown generally at 20 in FIGS. 1 and 2.

The electron beam source assembly 20 defines a generally rectangular copper block 2 with a circular copper crucible 4 having frustoconical side walls 6, a bottom wall 8, and lip 10.

Conventional passages 12 are formed in the block 2 for circulation of water, or another suitable coolant, from the coolant inlet 14, through the passages 12, to the outlet 15. Conventional fasteners 16 and high voltage connector straps 18 are provided.

The base plate 22 of the block 2 is fabricated from a magnetic material which provides a low reluctance path. A rectangular permanent magnet 24 is positioned on the base plate 22 along one long side of the block 2, and a second rectangular permanent magnet 25 is positioned on the base plate 22 along the opposed long side of the block 2 and parallel to magnet 24. Magnet 24 is placed with its North pole at the top of the assembly and its South pole at the base plate 22. Magnet 25 is placed with its South pole at the top of the assembly and its North pole at the base plate 22. The top of the crucible 4 is substantially level with the top surfaces 26 of each magnet 24,25. Mounted outboard of permanent magnets 24,25 are opposed electromagnetic coils 17, 19 having electrical connectors 27 for supplying a variable amount of current to the coils.

Figure 8:
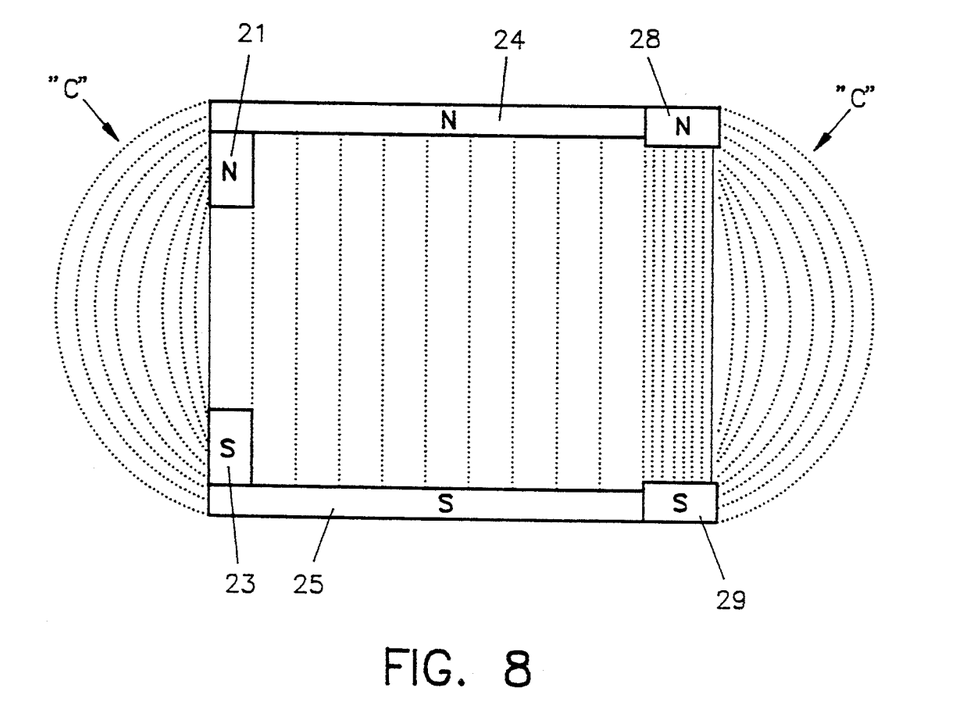
FIG. 8 is a top view of the magnetic structure shown in FIG. 7 showing the magnetic field lines.
Figure 9:
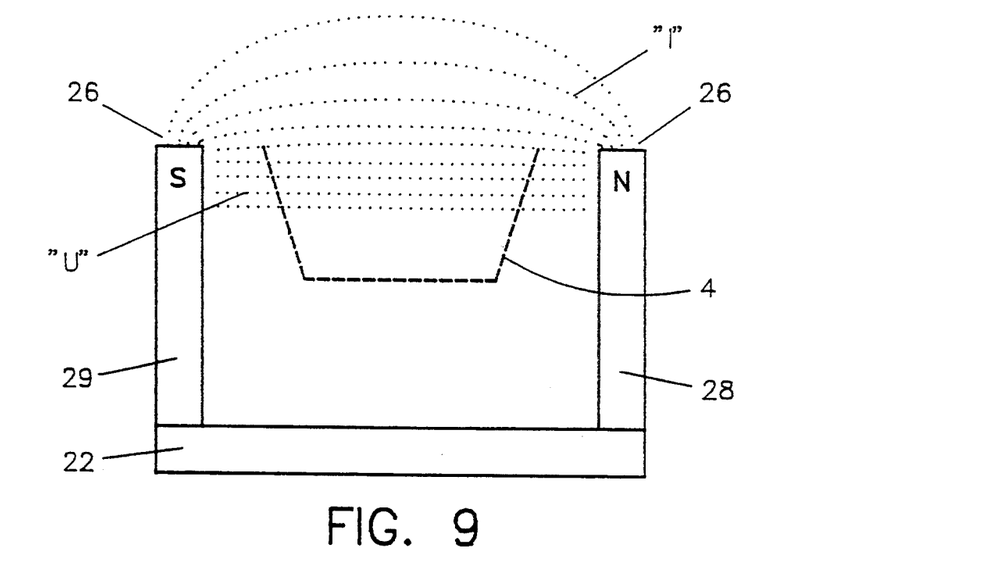
FIG. 9 is an end view of the magnetic structure shown in FIG. 7 with the magnetic field lines and with the crucible in hidden view.

Referring now to FIGS. 8 and 9, a second pair of opposed permanent magnets 28,29 are mounted on the base plate 22 and on planar end surfaces of magnets 24,25. The smaller permanent magnets 28,29 are preferably of the same height as magnets 24,25, although other configurations and heights may be suitable for other embodiments. The polarities of magnets 28,29 are arranged the same as the polarities of magnets 24,25.

A third pair of opposed permanent magnets 21,23 are mounted on the base plate 22 and on the planar surfaces of magnets 24,25 at the opposite end of the block 2. The magnets 21,23 are preferably of the same height as magnets 24,25, although other configurations and heights may be suitable for other embodiments. The polarities of magnets 21,23 are arranged the same as the polarities of magnets 24,25.

The magnetic field lines produced by the arrangement of the permanent magnets 24,25,28,29,21,23 in conjunction with the magnetic base plate 22, are transverse uniform field lines "U" between the magnets, plano-convex field lines "I" above the top surfaces of the magnets and extending outwardly from the ends of the magnets, and convex field lines "C" above the plano-convex field lines "I" and extending outwardly from the ends of the magnets beyond the "P" field lines.

The magnetic field created by the presence of four magnets at each end of the electron beam source assembly 20 is stronger because of the closer spacing between the poles. As can be seen, there are no uniform magnetic field lines "U" above the lip 10 of the crucible 4, and unwanted magnetic flux at and passing through the crucible is substantially eliminated by the low reluctance path created by base plate 22.

Figure 3:
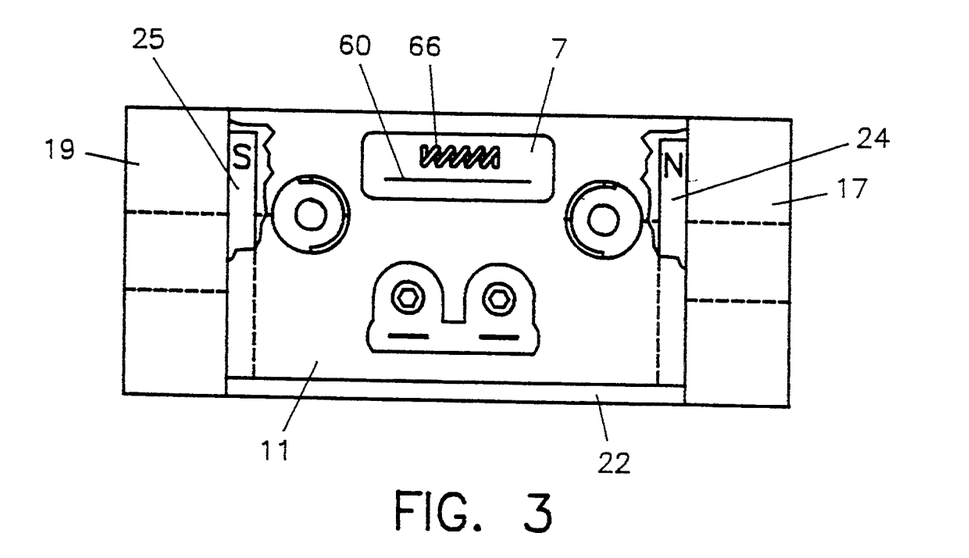
FIG. 3 is an end view of the electron beam source assembly of FIG. 1 showing the filament of the electron gun mechanism, and with a partial cut away view of the magnetic structure.
Figure 4:
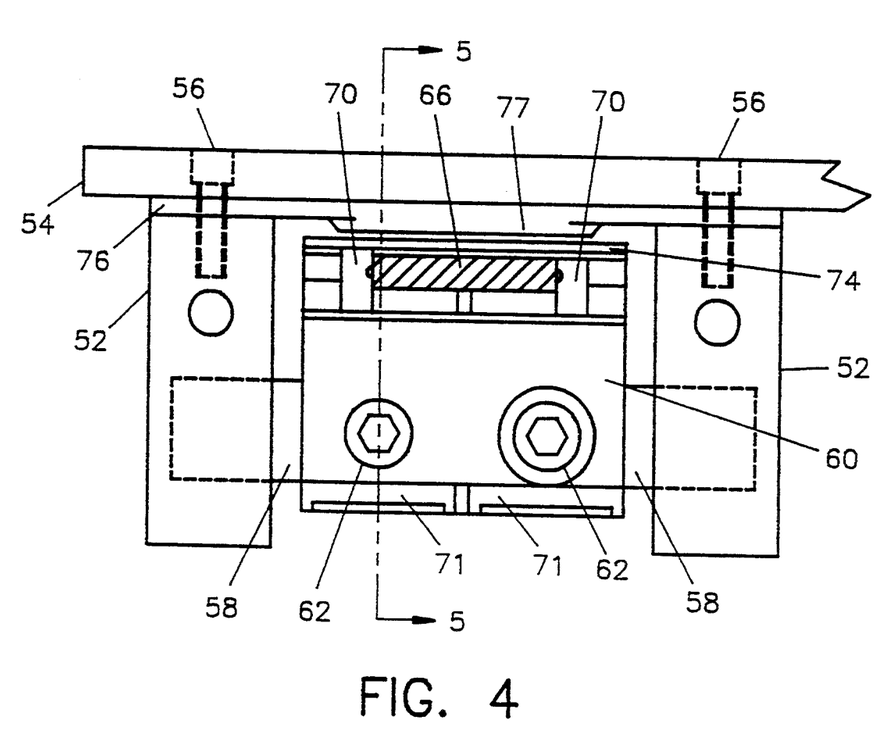
FIG. 4 is an end view of the filament and electron gun mechanism shown in FIG. 3 without the housing.

Referring now to FIGS. 2, 3, 4 and 5, the electron gun mechanism is shown generally at 50 housed in a recess 3 at an end of block 2. As best shown in FIG. 3, the electron gun mechanism 50 is substantially enclosed within the electron beam source assembly 20, with the exception of a window 7 formed in a removable end cover 11. Enclosing the electron gun mechanism 50 keeps the emitter mechanism clean and prevents particle deposition and build up.

The electron gun mechanism includes a top cover 54 mounted to a left and a right support block 52 with screws 56. A high voltage insulator block 58 extends between and mounts to left and right support blocks 52.

A coiled emitter filament 66 formed preferably from tungsten wire, wrapped to provide greater surface area, is mounted with screws 68 between right and left hand filament clamps 70 attached by screws to the top and bottom of a split cathode block assembly, the block 72 having uniform planar surfaces, and preferably made from molybdenum. The cathode block assembly includes a beam former plate 74 attached to the top of the cathode block 72 with a metallic screw 73, and a beam deflection shield 60 attached to the front surface of the cathode block 72 with screws 62 by passing the screw 62 through a filament block insulator 64 and into the cathode block 72. The two parts of the split cathode block assembly form electrically separated dipoles thereby creating electrostatic equilibrium. An anode plate 76, preferably made from tantalum, is mounted below the cover 54 and defines a downwardly extending leg 77. It will be recognized by those skilled in the art that other substances may be used for the filament 66, the cathode block assembly, and the anode plate 76.

Figure 5:
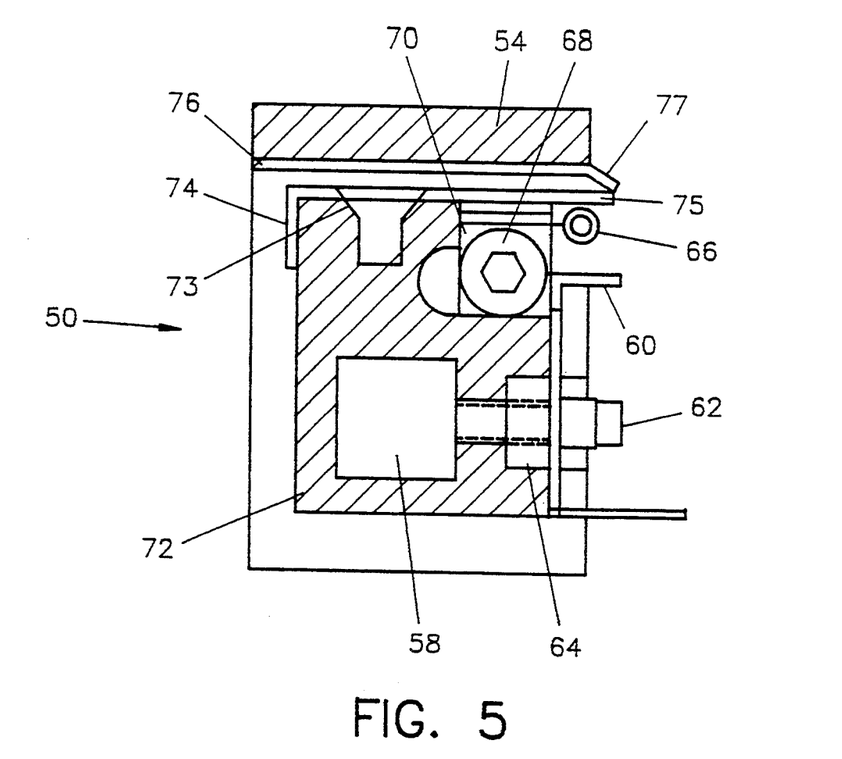
FIG. 5 is a sectional view of the electron gun mechanism taken along lines 5—5 in FIG. 4.
Figure 6:
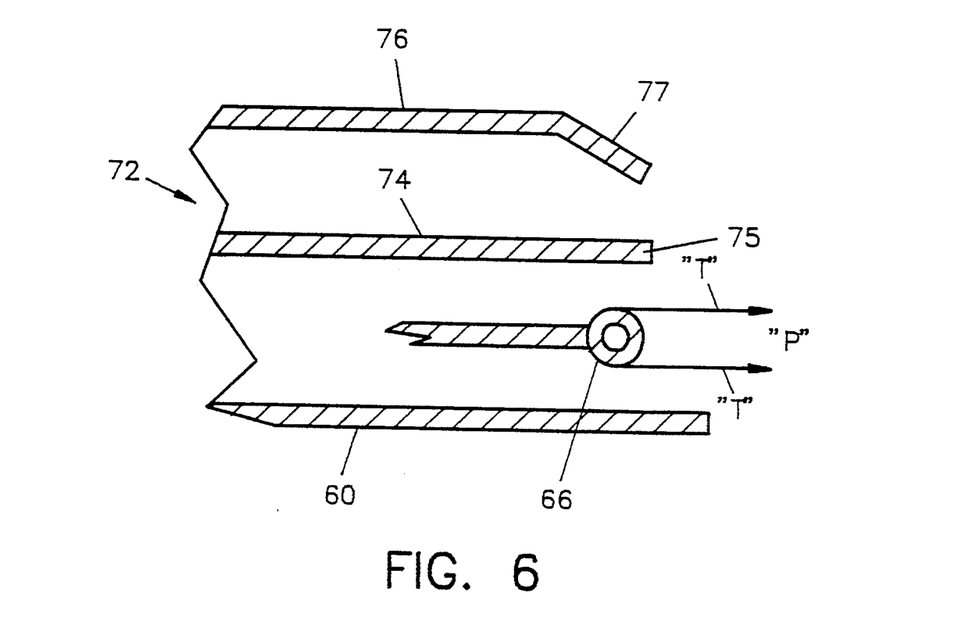
FIG. 6 is an enlarged side sectional view of the placement of the filament relative to the cathode assembly and the anode.

As best shown in FIGS. 5 and 6, the cathode block 72 is located behind the filament 66, the beam deflection shield 60 an anterior portion 75 of and the beam former plate 74. The filament is between the beam deflection shield 60 and the beam former plate 74 with the anode disposed above the beam former plate 74 to create an unobstructed path shown by arrow "T" from the filament 66 for the emitted electrons.

Figure 7:
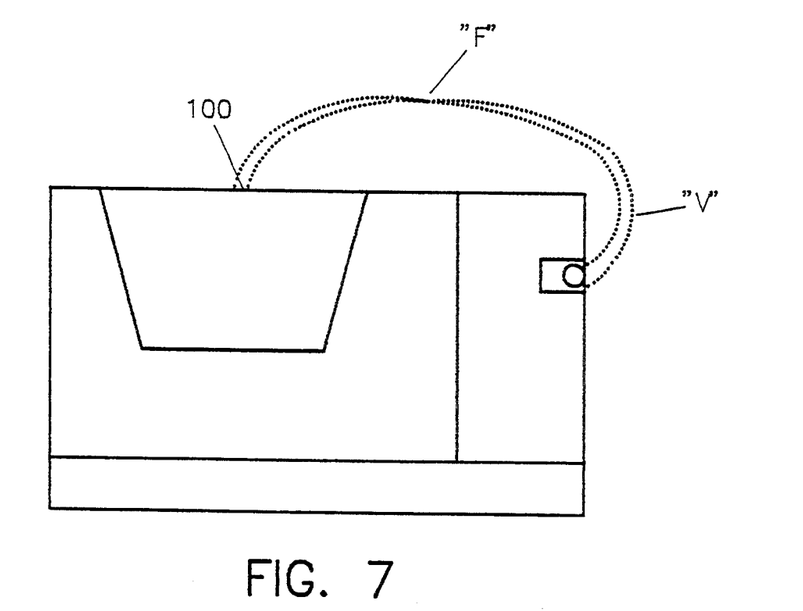
FIG. 7 is a side view of the magnetic structure showing the path followed by the electron beam from the electron gun to the crucible which is shown in hidden view.
Figure 10:
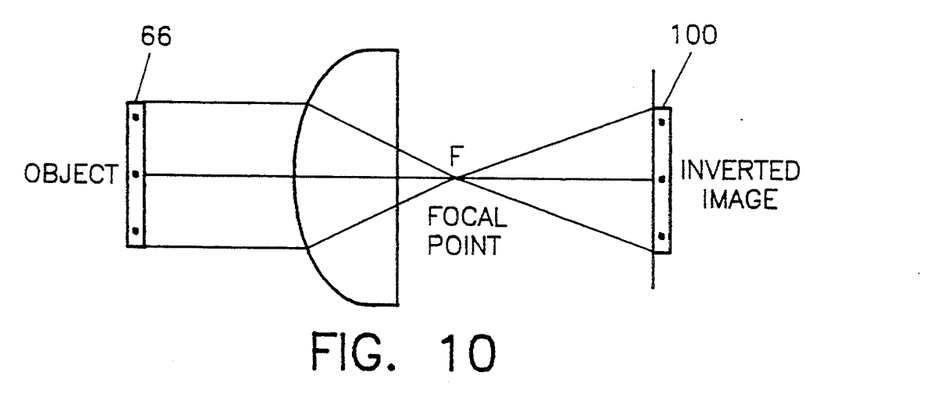
FIG. 10 is a diagrammatic view of an image produced by an model plano-convex optical lens system.

Alternating current, preferably providing up to 1000 watts of power from a conventional transformer (not shown), is used to heat the filament 66 to approximately 1900° K. to initiate electron emission. The alternating current causes the excited electrons to be emitted perpendicular to the filament 66 into a uniform electrostatic field around the filament 66 thereby enabling the emitted electrons to follow the path "P" through the steep electrostatic field created by the application of direct current to the split cathode block assembly out of the electron gun assembly 50 through the window 7 without interference from magnetic field lines created by the magnetic structures 24,25,28,29. As the electrons are emitted in a straight path from the filament through uniform, steep electrostatic forces, they are concentrated in the image of the filament. As the electron beam travels away from the steep electrostatic field created by the cathode structure, the electron beam image travels upwardly toward the anode leg 77 where it is sharply deflected by the strong plano-convex magnetic field formed by the arrangement of the magnetic structure discussed above to assume a trajectory "V" shown in FIG. 7. The trajectory carries the electron beam through only plano-convex field lines "C" thereby causing the electron beam to converge at focal point "F". The beam reconverges at the target 100 at the top of the crucible 4 to form an inverted image of the filament at substantially one-to-one mapping. The path of the electron beam is illustrated using a diagram of a model plano-convex lens in FIG. 10. The decreased magnetic flux around and through the crucible, provided from the low reluctance path created by the magnetic base plate 22, enables the electron beam to travel in a substantially straight path through the crucible while maintaining substantially the image of the filament. The impact point of the beam with the crucible may be altered by selectively varying the current to one, or both of the electromagnetic coils 17,19.

Additionally, as the trajectory of the electron beam enters the crucible, it faces the strong magnetic field created by permanent magnets 21, 23. This strong magnetic field deflects any stray electrons from the beam back toward the center of the crucible 4 thereby centering the beam. The magnetic field created by magnets 21, 23 also captures secondary electrons which may be deflected off the sides of the crucible 4.

Figure 12A:
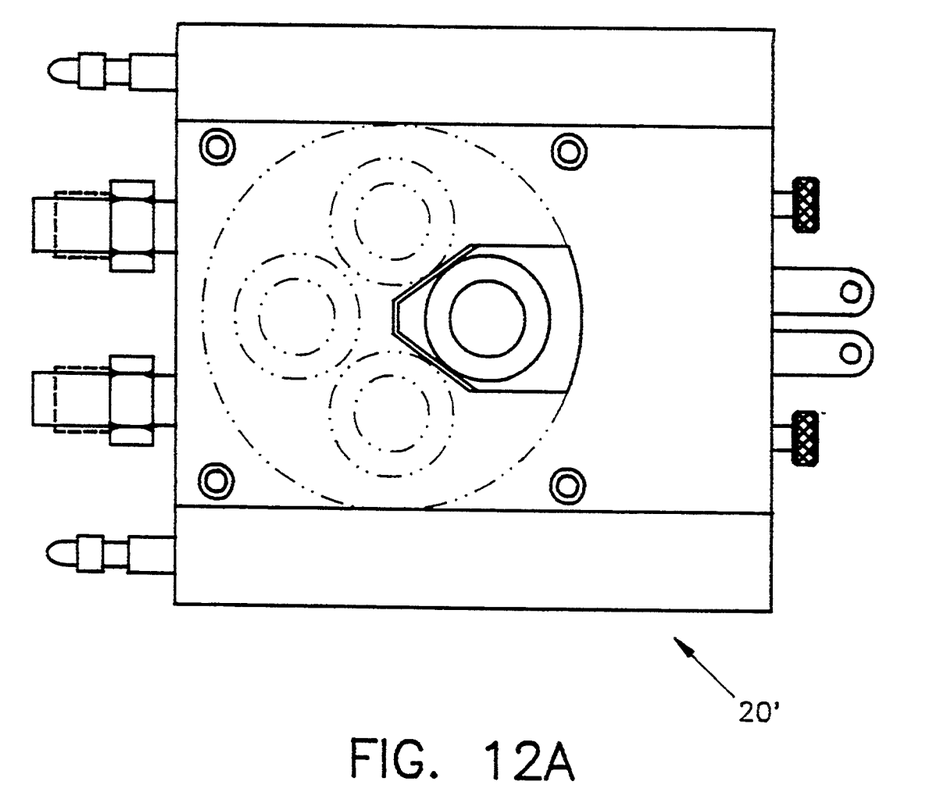
FIG. 12A and 12B are respectively a top view and a side view of another aspect of the present invention showing an electron beam source assembly with four crucibles to enable deposition of multiple thin film layers upon a substrate.
Figure 12B:
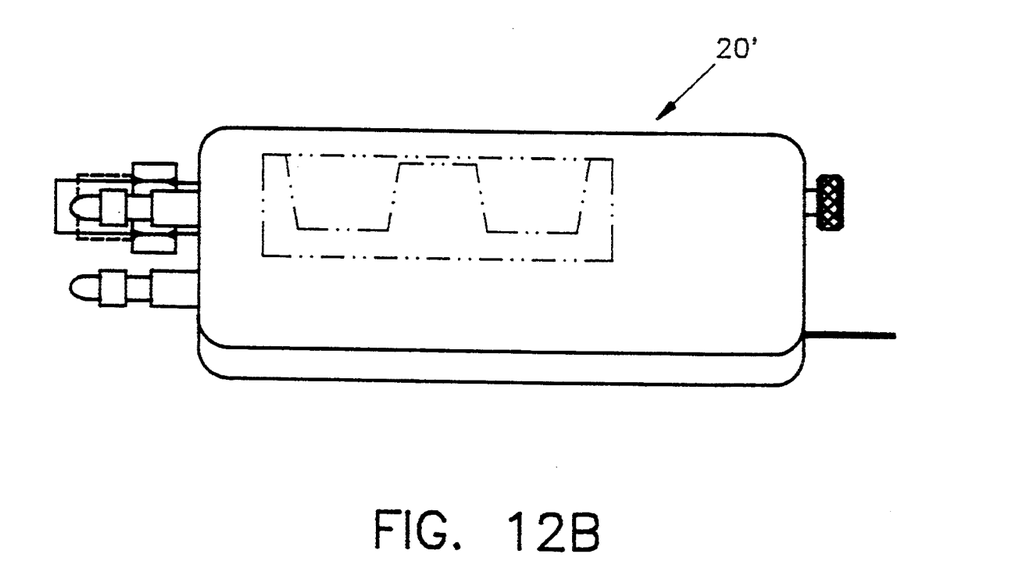

In another aspect of the present invention shown in FIGS. 12A and 12B, the electron beam source assembly 20' has multiple crucibles for depositing multiple thin film layers of materials on a substrate. The ability to focus the inverted beam aided by the variable current to the electromagnetic coils enables the substrate and beam to be moved to another crucible if desired, or in the apparatus shown, the crucibles are rotated into position beneath a stationary substrate. It will be recognized by those skilled in the art that the present invention is also applicable for a linear array of crucibles.

Figure 11:
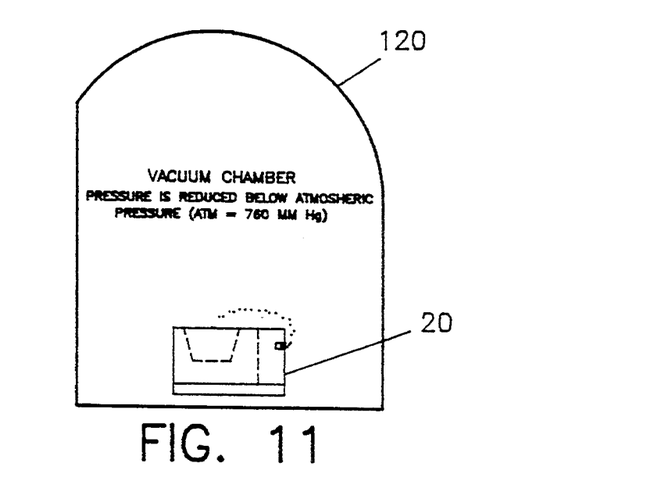
FIG. 11 is an environmental view of the electron beam source assembly of the present invention in a high vacuum environment.

Referring now to FIG. 11, the electron beam source assembly 20 is shown in an environmental view within a large stainless steel vacuum chamber 120 maintained, for example, at a reduced atmospheric pressure below 760 mm Hg. A reduced atmospheric pressure is necessary to allow the electron beam to travel its mean free path prior to collision with a target.

While a rectangular electron beam assembly has been described, it will be apparent to those skilled in the art that the invention is applicable to other configurations, such as circular, ovoid or square.

To those skilled in the art to which the present invention pertains, many widely varying embodiments and implementations of the principles of the present invention will be suggested from the foregoing. For instance, the electron beam source assembly may be used in any high or ultra high vacuum environment utilizing a bent electron beam. The invention has applications in the semiconductor industry, and for providing an electron beam source for facilitating production coating of thin solid film onto a substrate, such as coatings for lenses, mirrors, jewelry and other decorative coatings, and automotive coatings. Modifications can also be made to enlarge or condense the image at the target using conventional projection technologies. Electromagnets may be used instead of permanent magnets, differing numbers of magnets may be used, a unitary magnetic structure may be used, and the magnets may be arranged in other configurations. The cover of the emitter mechanism may be omitted if desired. The description and the disclosures present herein are by way of illustration only and should not be considered to limit the present invention, the scope of which is more particularly set forth in the following claims.

What is claimed is:

1. An electron beam source assembly for providing a beam of electrons to a crucible mounted in a housing in a high vacuum environment, the assembly comprising:

magnetic means for generating a transverse magnetic field having a plurality of types of field lines, the magnetic means comprising parallel, spaced apart first, second and third pairs of magnets having opposed poles and mounted on a low reluctance path means located beneath the crucible, the crucible located between the first pair of magnets, the second pair of magnets mounted to first ends of the first pair of magnets, the third pair of magnets mounted to second ends of the first pair of magnets;

an emitter means comprising an electron medium defining a shape, a means for causing electrons to be emitted from the medium, the electrons emitted in the shape of the medium, and a means for accelerating said emitted shape in a first direction away from the plurality of types of magnetic field lines and outside of the electron beam source assembly to travel in an electron beam trajectory for deflection through one of the plurality of types of magnetic field lines towards a desired and moveable imaging point at the crucible, the electron beam at the imaging point defining substantially the shape of the electron medium.

2. The electron beam source assembly of claim 1 wherein the crucible is mounted substantially flush with a top plane of the housing.

3. The electron beam source assembly of claim 1 wherein the one of the plurality of types of magnetic field lines is plano-convex magnetic field lines.

4. The electron beam source assembly of claim 1 wherein the emitted electrons are accelerated and injected outside of the housing and outside of a range of influence of the plurality of types of magnetic field lines.

5. The electron beam source assembly of claim 1 wherein the means for accelerating the emitted shape away comprising a cathode block assembly positioned posterior to the electron medium and a window in the housing anterior to the electron medium.

6. The electron beam source assembly of claim 1 further comprising cover means for protecting the emitter means.

7. The electron beam source assembly of claim 1 wherein the plurality of magnetic field lines comprises uniform field lines between the first, second and third pairs of magnets and within the crucible, plano-convex field lines above the pairs of magnets and above the crucible and extending outwardly from the first and the second ends of the first pair of magnets, and convex field lines above the plano-convex field lines.

8. The electron beam source assembly of claim 7 wherein the emitted shape outside of the electron beam source assembly is deflected by the first and second pairs of magnets into the plano-convex field lines and travels as an electron beam only through the plano-convex field lines towards the desired and movable imaging point.

9. The electron beam source assembly of claim 8 wherein the electron beam converges once to form a focal point and diverges once at the imaging point.

10. The electron beam source assembly of claim 8 wherein the electron beam at the crucible is substantially a one to one mapping of the shape of the electron medium.

11. The electron beam source assembly of claim 1 further comprising a plurality of crucibles.

12. The electron beam source assembly of claim 1 further comprising means for moving the imaging point.

13. The electron beam source assembly of claim 12 wherein the means for moving the imaging point comprises electromagnetic coil means with a variable current supply and mounted outboard of the low reluctance path means and the first pair of magnets.

14. An electron gun assembly for vaporizing substances in a high vacuum environment, the assembly comprising:

a housing defining a top, a bottom, sides, and ends, a first of the ends having an aperture therein;

a crucible means for placement of the substances to be vaporized and having a lip formed substantially flush with the top of the housing;

magnetic field means for providing a plurality of types of magnetic field lines;

top shield means for coveting the emitter means; and an emitter means housed in the aperture and comprising a filament, a cathode assembly defining a cathode block posterior of the filament, a beam former attached to the cathode block and extending outwardly therefrom above the filament, a beam deflector shield attached to the cathode block and extending outwardly below the filament, and an anode positioned above the beam former, the emitter means for providing an electron beam for vaporizing the substance in the crucible means.

15. The electron gun assembly of claim 14 wherein alternating current causes electrons to be emitted from the filament, the emitted electrons forming the shape of the filament and travelling as an electron beam in said shape in a direct path through a window in a cover for the aperture and adjacent to the emitter means, outside the housing, and beyond the plurality of magnetic field lines.

16. The electron gun assembly of claim 15 wherein the electron beam outside of the housing begins to travel upwardly toward the anode and is sharply deflected by one of the plurality of types of magnetic field lines towards the crucible, the electron beam converging once and diverging once as it travels through the one type of magnetic field lines until it reaches the crucible in the shape of the filament.

17. The electron gun assembly of claim 14 wherein the magnetic field means comprises a first, second and third pair of opposed, parallel, spaced apart magnets mounted on a low reluctance path means, the first pair of magnets positioned at the sides of the housing with the crucible means therebetween, the second pair of magnets mounted to a first end of the first pair of magnets, the third pair of magnets mounted to a second, end of the first pair of magnets.

18. The electron gun assembly of claim 17 wherein the plurality of magnetic field lines comprises uniform field lines between the first, second and third pairs of magnets and within the crucible means, plano-convex field lines above the pairs of magnets and above the crucible means and extending outwardly from the first and second ends of the first pair of magnets, and convex field lines above the plano-convex field lines.

19. The electron gun assembly of claim 14 comprising a plurality of crucible means.

20. The electron beam source assembly of claim 17 further comprising means for positioning the electron beam at the crucible means.

21. The electron beam source assembly of claim 20 wherein the means for positioning the electron beam at the crucible means comprises electromagnetic coil means with a variable current supply and mounted outboard of the first pair of magnets.

22. An electron emitter assembly for providing a beam of electrons in a high vacuum environment of the type having electron beam deflection apparatus, the assembly comprising:
   support block means for mounting the assembly within the high vacuum environment;
   cover means for shielding the assembly;
   a split cathode block defining substantially parallel cathode plates separated by a recess in the block, the parallel cathode plates having substantially uniform planar surfaces;
   beam former plate means having a substantially uniform planar surface and attached to a top surface of the cathode block, the beam former plate means extending beyond a front face of the cathode block;
   beam deflection shield means having a substantially uniform planar surface and attached to a front surface of the cathode block, the beam deflection shield means defining a leg extending beyond the front face of the cathode block;
   filament means mounted within the recess, beyond the front surface of the cathode block, and between the beam formed plate positioned above and the beam deflection shield means positioned below, the filament means positioned to provide an unobstructed path for emission of the electrons in a direction of travel above the leg of the beam deflection shield means and outside of a range of influence of the electron beam deflection apparatus;
   anode plate means mounted above the beam former plate means and defining means for diverting the emitted electrodes from the path into the range of influence of the electron beam deflection apparatus; and
   power means for heating the filament for emission of electrons.

23. The electron emitter assembly of claim 22 wherein the parallel cathode plates are separated dipoles and are maintained at a voltage potential substantially equal to an voltage potential of the beam deflection shield means.

24. The electron emitter assembly of claim 22 wherein the beam deflection shield means further comprises an insulator means on a side thereof for prevention of electrical conduction.

25. The electron emitter assembly of claim 22 wherein the beam deflection shield means is formed in two sections separated by a narrow gap therebetween.

26. The electron emitter assembly of claim 22 wherein the power source is alternating current.

* * * * *